(12) United States Patent
Rahut et al.

(10) Patent No.: US 6,766,504 B1
(45) Date of Patent: Jul. 20, 2004

(54) INTERCONNECT ROUTING USING LOGIC LEVELS

(75) Inventors: Anirban Rahut, San Jose, CA (US); Sudip K. Nag, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/213,774

(22) Filed: Aug. 6, 2002

(51) Int. Cl.$^7$ .............................................. G06F 17/50
(52) U.S. Cl. .............................. 716/13; 716/12; 716/14
(58) Field of Search ......................... 716/8–14; 714/726

(56) References Cited

U.S. PATENT DOCUMENTS

| | | | | |
|---|---|---|---|---|
| 5,557,531 A | * | 9/1996 | Rostoker et al. | 716/1 |
| 5,937,190 A | * | 8/1999 | Gregory et al. | 717/131 |
| 6,067,650 A | * | 5/2000 | Beausang et al. | 714/726 |
| 6,263,478 B1 | * | 7/2001 | Hahn et al. | 716/10 |
| 6,367,060 B1 | * | 4/2002 | Cheng et al. | 716/10 |
| 6,591,407 B1 | * | 7/2003 | Kaufman et al. | 716/10 |

OTHER PUBLICATIONS

Jiang, Y.–M. et al., "Dynamic timing analysis considering power supply noise effects", Quality Electronic Design, 2000. ISQED 2000. Proceedings. IEEE 2000 First International Symposium on Mar. 20–22, 2000 pp.: 137–143.*

Frankle, Jon, "Iterative and Adaptive Slack Allocation for Performance–Driven Layout and FPGA Routing" Paper 34.1, pp. 536–542, 29.sup.th ACM/IEEE Design Automation Conference Proceedings 1992, Jun. 8–12, 1992, Anaheim, California.*

Jing–Jia Liou et al., "False–path–aware statistical timing analysis and efficient path selection for delay testing and timing validation", Design Automation Conference, 2002. Proceedings. 39th, Jun. 10–14, 2002 pp.: 566–569.*

Youssef, Habib, Shragowitz, Eugene, "Timing Constraints for Correct Performance", Digest of Technical Papers, pp. 24–27, IEEE International Conference on Computer–Aided Design ICCAD–90, Nov. 11–15, 1990, Santa Clara, California.*

Sutanthavibul, S. et al., "Cell–based physical design under timing constraints", Circuits and Systems, 1990., IEEE International Symposium on, May 1–3, 1990 pp.: 877–880 vol. 2.*

* cited by examiner

*Primary Examiner*—Vuthe Siek
*Assistant Examiner*—Naum Levin
(74) *Attorney, Agent, or Firm*—W. Eric Webostad

(57) ABSTRACT

Method and apparatus is described for interconnect routing. More particularly, an integrated circuit may be thought of as a network with a plurality of resources that are interconnected. These resources may be blocks of circuitry or individual circuit elements. By first routing in a resource mode, critical connections are identifiable. After that routing, a deterministic approach to delay mode routing is described using logic level information. Connections within a logic level are independent, thereby allowing multiple connections for a logic level to be routed together without any need for timing update.

22 Claims, 7 Drawing Sheets

INTERCONNECT ROUTING USING LOGIC LEVELS

FIELD OF THE INVENTION

The invention relates generally to interconnect routing, and more particularly to routing interconnects for a network, as may be found in an integrated circuit.

BACKGROUND OF THE INVENTION

Integrated circuits comprise many interconnects for connecting blocks of circuitry. Accordingly, computerized routing tools for routing interconnects for connecting blocks of circuitry have been developed to handle this data intensive task.

Associated with each interconnect is a time delay. This interconnect delay may be characterized from a driver to a load. Stated another way, there is a delay between the time when a signal leaves an output of one circuitry block and arrives as an input to another circuitry block. This delay may be associated with one or more types of delays, such as signal propagation delays and clock-to-output delays, among other known types of delays. Accordingly, target delays are respectively associated with connections. A slack on a connection is the difference between actual delay and target delay. A negative slack indicates that a target delay is not being met, and a positive slack indicates that a target delay is being met. A path, formed by one or more connections has a path delay determined by the delay of its constituent connections. A path may have an associated delay target, in which case a "path slack" is the difference between a path's target and actual delay.

A routing tool in a delay routing mode is configured to at least attempt to obtain a minimum interconnect delay using time delay as a primary criteria for evaluating possible routing paths from one block of circuitry, a "driver," to another block of circuitry, a "load." A routing tool in a resource (minimum resource) routing mode is configured to at least attempt to obtain a minimum number of resources using number of resources as a primary criteria for evaluating possible routing paths from a driver to a load. These different routing modes conventionally generate different results. Impact of these different routing modes may affect performance, for example operating frequency of an integrated circuit, and cost, such as die size.

Conventionally, in timing driven routing, slack allocation and analysis is done to determine delay targets for interconnects, and then these delay targets are used to at least attempt to produce routes for interconnects meeting such targets. In connection slack allocation, slack for a path is distributed or otherwise divided, not necessarily, equally among connections forming such a path. Thus, targets are provided for each connection in a path based on a portion of path slack. There are some limitations to this approach.

First, accurately predicting achievable interconnect delays is difficult. Conventionally, a heuristic based on fan out or current delay criteria is used. Moreover, this prediction is made even more difficult in integrated circuits that have different fan out characteristics based on programmed configuration, such as programmable logic devices (PLDs). Examples of such PLDs include, but are not limited to, Complex Programmable Logic Devices (CPLDs) and Field Programmable Gate Arrays (FPGAs).

Secondly, allocation of path slack among connections forming a path does not take into account, for example, whether a connection on such a path can exceed such a target, and whether it would be beneficial for such a target to be exceeded. A routing tool or "router" operating in a mode to meet delay targets does not attempt to surpass such targets. In other words, beating, and not just meeting predicted targets can alleviate requirements from other connections with negative slack. In such instances exceeding interconnect delay targets, i.e., using less delay than targeted, can allow other interconnects not to meet their respective interconnect delay targets and still achieve overall circuit performance.

One modification to time-driven routing as described above is to perform slack allocation, for example with a timing engine, and then route critical interconnects in delay mode. However, this modification runs the timing engine quite often to capture the benefit of delay mode routing of the critical interconnects, and thus there is a cost of doing a timing analysis for each of such runs. If impact of exceeding requirements by routing in delay mode is not captured by rerunning the timing engine, then excessive work may be done on what appears to be a critical connection but is no longer critical, as routing of some other connection(s) upstream or downstream in its path has alleviated criticality of such a connection.

Conventionally, a critical interconnect is one in which path slack is a negative value. Thus, if a routed path delay does not meet a target path delay for a path, then a negative value for path slack results.

Accordingly, it would be both desirable and useful to provide method and apparatus for routing fewer interconnects though in a delay mode in order to meet the desired circuit performance. Moreover, it would be both desirable and useful to provide method and apparatus for routing interconnects with reduced runtime expense for timing updates.

SUMMARY OF THE INVENTION

An aspect of the present invention is a method for identifying routing for interconnects for an integrated circuit. Logic level value for the interconnects are identified. The interconnects are routed responsive to a first criteria. Timing information associated with the interconnects routed is updated. A set of at least one connection from the interconnects responsive to the updated timing information is assembled, where the at least one connection has a respective negative slack. A logic level of the logic levels responsive to at least a portion of the set is identified, and at least one connection for the identified logic level is rerouted responsive to a second criteria. Timing information is updated. This process of assembling sets and selecting logic levels to route responsive to the second criteria may be continued, until there are no more connections with negative slack, or all the connections with negative slack have been routed responsive to the second criteria.

An aspect of the present invention is a method for routing connections for a network. Logic levels for the network are identified. Connections of the network responsive to the logic levels are identified. Path slacks for the paths are obtained, and minimum path slacks are ascribed to each of the connections responsive to the path slacks.

An aspect of the present invention is a method for routing connections for a network. A threshold number, such as a maximum or a minimum, of the connections needed to traverse from each source object to each connection is identified, and logic levels are indexed in response to the threshold number of the connections identified.

An aspect of the present invention is a method for routing interconnects for a network. The network is characterized into logic levels having a property of independence, such as in relating to timing update, of connections within each of the logic levels, and the connections within a logic level are changed in state, such as by routing.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE DRAWINGS

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

Prior to an explanation of the invention, it is important to appreciate how the invention departs from conventional thought. One might expect that a router operating in a delay mode on connections in a sorted order based on minimum path slacks instead of connections slacks produces desirable consequences. However, this is not the situation. Such a router operation may be thought of as an "over-constrained problem." In other words, such a router will attempt to find a least delay route for all connections of all critical paths, which can lead to higher congestion in routing. Ideally, a minimum number of connections for routing in delay mode would be picked to meet all delay targets.

In contrast to conventional thought, trying to obtain a best possible delay for all routes is not needed, and in fact produces a sub-optimal result as previously stated. This is because some connections in a design will have available slack such that improvement does not change overall integrated circuit effective performance, and so routing such connections for minimum delay consumes more resources than necessary, and may result in unnecessary congestion.

Notably, since connections in a logic level represent timing independent connections, all critical connections within a selected logic level can be routed at a time, without a need for an intermediate timing update. This departure from conventional thought is described in more detail with reference to FIGS. 1 through 5. Moreover, there may be little to no difference in routing runtime between a target delay, of the prior art, and a minimum delay, as described below. Thus, there is little to no increase in runtime though better performance may be obtained. Furthermore, conventionally the shortest path is the path of least delay, so less runtime searching needs to be done for a path of minimum delay.

Figure 1A:
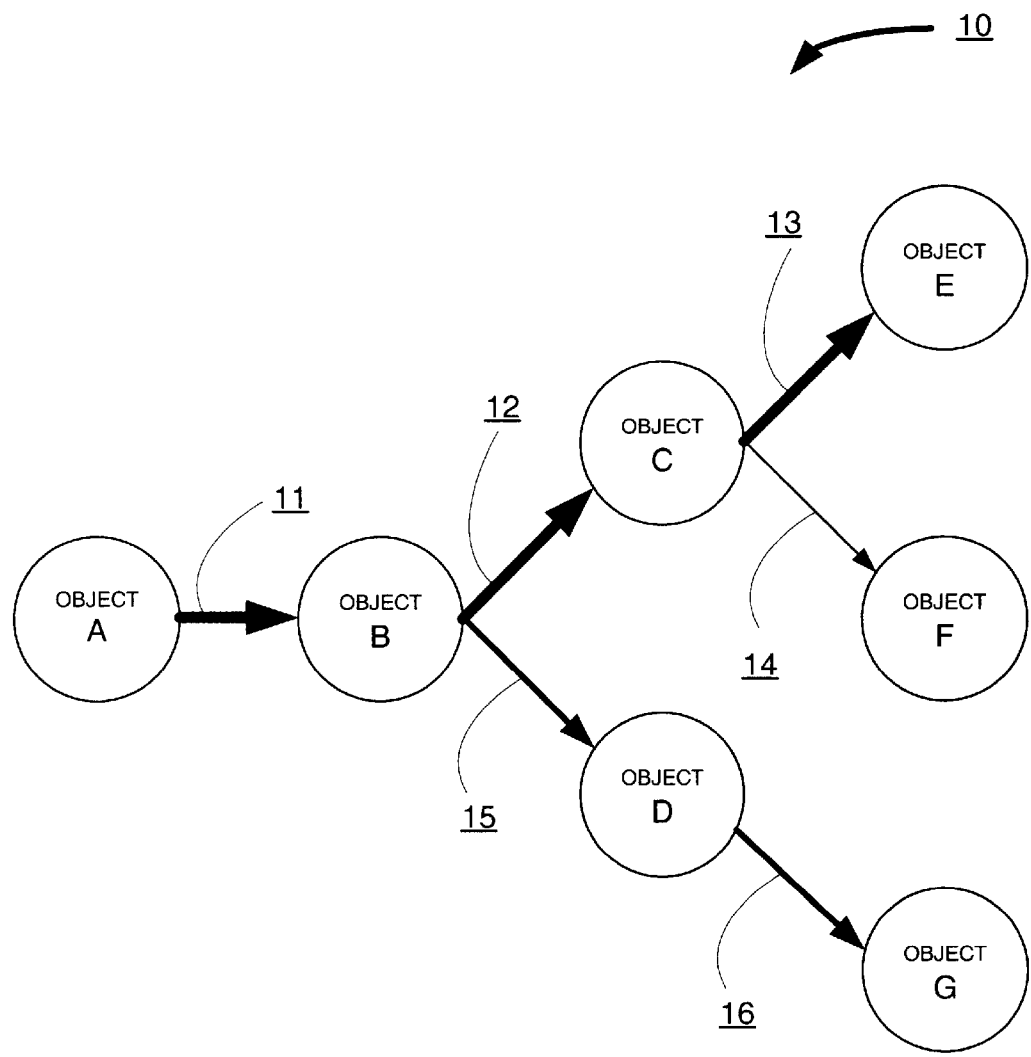
FIGS. 1A, 1B and 1C are network diagrams for illustrating an exemplary portion of a network of interconnections of an integrated circuit in accordance with one or more aspects of the invention.

FIG. 1A is a network diagram for illustrating an exemplary portion of a network 10 in terms of resources and connections in accordance with one or more aspects of the invention. Network 10 is a network comprising objects A, B, C, D, E, F and G, and connectors or connections 11, 12, 13, 14, 15 and 16. Passing signal from driver object A to load object B uses connection 11 as indicated from an arrow pointing to object B. Passing signal from driver object B to load object C or D uses connection 12 or 15, respectively. Passing signal from driver object C to load objects E and F uses connections 13 and 14, respectively. Lastly, moving signal from driver object D to load object G uses connection 16.

It was found that routing critical connections of a selected logic level for minimum delay was better than routing many connections to meet heuristically determined targets. Notably, all connections, critical and non-critical, within a logic level as used herein may be routed at one time. Thus, rather than routing all of connections 11 through 16 in delay mode, it is better to address routing only one or more critical connections of a selected logic level, such as connection 11 in this example, and then determine effect of delay reduction of such critical connection routing. By routing of one or more critical connections of a selected logic level, downstream connections or upstream connections or both are made less critical thereby needing less connections to be routed in delay mode, leading to lesser constraining of the design.

In order to facilitate clarity, some definitions for describing network 10 may be useful. A connection may be expressed as a segment connecting two resources, such as from a driver object to a load object. Thus, there is directionality associated with a connection, namely, an output of one object to an input of another object. A path is a set of one or more connections having a direction, where for a path with multiple connections, an intermediate load object for a prior connections is a driver object for a subsequent connection. A path starts at a state element(or primary input) and ends at a state element (or primary output). So, for example, object A may be a flip-flop and object E may be another flip-flop.

Performance requirements of a circuit may be represented as path delay targets. Thickness of arrows for connections 11 through 16 is used to provide a visual indication of criticality of such connections. For this example of FIG. 1A, thicker connections are more critical than thinner connections.

Path slack ("PathSlack"), as stated above, is the difference in target delay for a path minus routed delay of such a path. Routed delay of a path can be calculated as the sum of the routed delay of its constituent connections. Routed delay may be determined in a known manner, for example at least in part by connection length as applied to a model for simulating physical effects of circuitry over such connection length. A floor delay is a minimum delay that a connection can physically attain according to a model simulation.

However, prior to further description of network 10, an understanding of router operations as used herein is advantageous.

Figure 2:
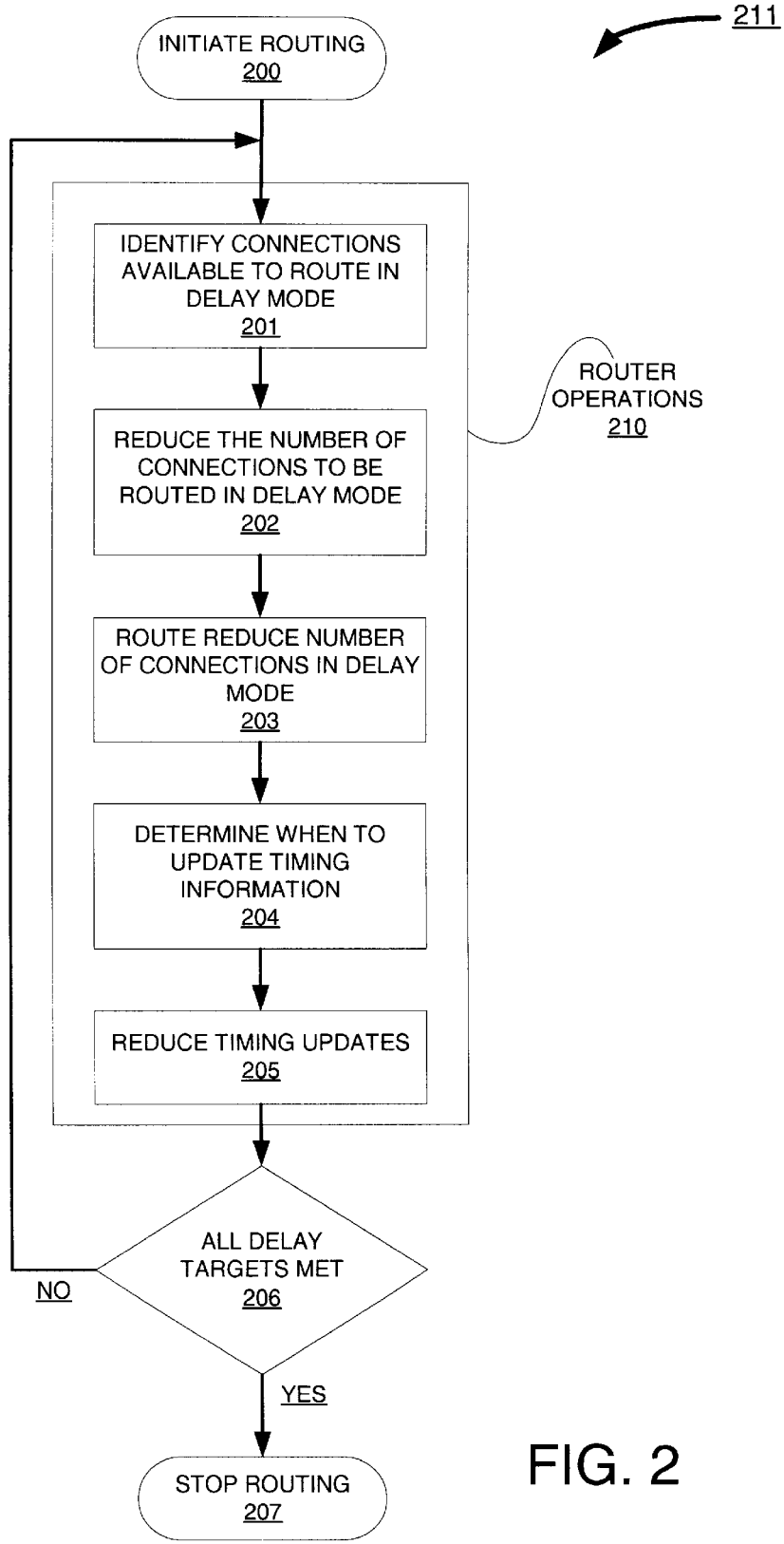
FIG. 2 is a flow chart of an exemplary embodiment of a router process in accordance with one or more aspects of the invention.

FIG. 2 is a flow diagram of an exemplary embodiment of a router process 211 in accordance with one or more aspects of the present invention. A router, operating in a delay mode for routing connections, is initiated at step 200. This causes one or more of router operations 210 to be executed. At step 201, connections available for routing in delay mode are identified. At step 202, at least an attempt is made to reduce the number of connections to be routed in delay mode. At step 203, a reduced number, when available, or a non-reduced number of connections are routed in delay mode. At step 204, it is determined whether timing information is to be updated. At step 205, at least an attempt to reduce timing information to be updated is made.

After router operations 210, at step 206 check is made to determine if all delay targets for a network have been at least been met. If all delay targets for a network have been met, then at step 207 routing is ended. If, however, all delay targets for a network have not been met, then routing continues at step 201. However, on a repetition of router operations 210, routing is now based on a previous routing of a subset of connections forming a network. Accordingly, this is an iterative approach until all delay targets have at least been met. Other criteria for stopping or otherwise ending router process 211, other than exhaustion of critical delays, may be used.

With respect to router operations 210, a set of one or more independent critical connections is used as a subset of connections for routing. This set of independent critical connections may therefore be routed in delay mode routing operation simultaneously. More particularly, by routing in delay mode, this set of independent critical connections is optimized for minimal delay. By routing a set of independent critical connections, router runtime is reduced while impact of such routing by selection of such a subset of connections for routing is enhanced.

To ensure independence of connections, connections are grouped into logic levels, as described below. A logic level is defined by identifying a threshold number, such as a maximum or a minimum, of connections needed to traverse from each source object to each connection. Logic levels are indexed in response to the threshold number of the connections identified. Connections within the same logic level are independent of one another. To further clarify understanding network 10 in terms of independence of connections, network 10 is re-characterized, as illustratively shown in FIG. 1B.

Figure 1B:
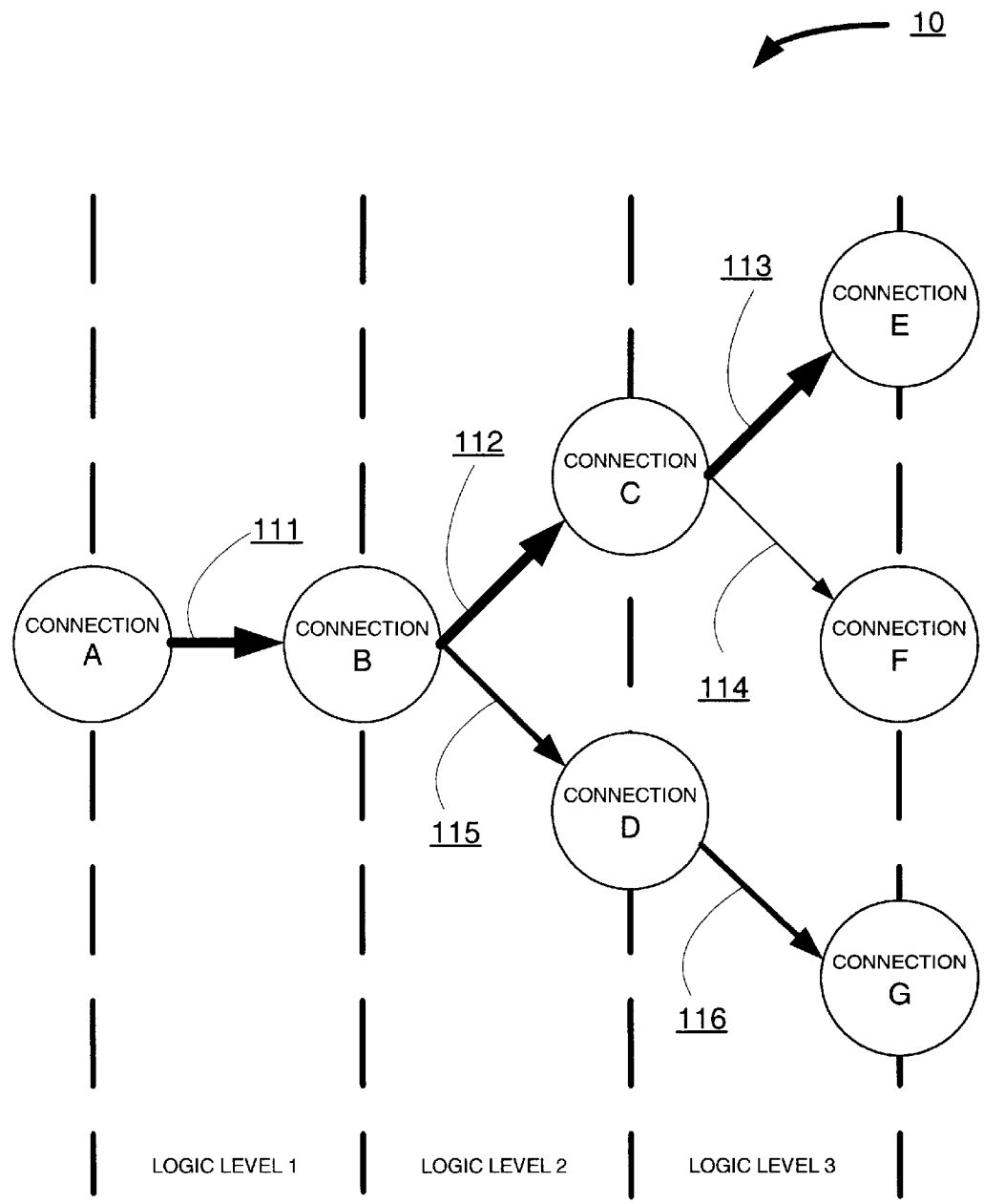

FIG. 1B is a network diagram for illustrating an exemplary portion of network 10 in terms of independent connections in accordance with one or more aspects of the invention. Network 10 of FIG. 1B comprises connections A through G, where edge parameters are associated as from one connection to another connection. From connection A to connection B (AB) is edge parameter 111. From connection B to connections C (BC) and D (BD) are respective edge parameters 112 and 115. From connection C to connections E (CE) and F (CF) are respective edge parameters 113 and 114, and from connection D to connection G (DG) is edge parameter 116.

As mentioned above, a path may comprise a plurality of connections. In the example of FIG. 2, there are three paths, which may be referred to by their respective sequence of connections, namely, ABCE, ABCF and ABDG.

Connections within a same logic level are independent by property or by definition of a logic level as used herein. This condition is met for associating connections A through G in the example of FIG. 1B into logic levels 1, 2 and 3. In the example of FIG. 1B, there are three independent sets (AB), (BC, BD) and (CE, CF, DG). This indicates that once it is decided to route a logic level in a delay mode, all critical connections in that logic level may be routed without any redundant delay minimization risk. This is because minimum path slack ("MinPathSlack"), the minimum of all PathSlacks going through a connection or passing through an object as in FIG. 1A, is unchanged with respect to other connections of a selected logic level. For example, for logic level 2, any change in delay in edge 112 has no effect in changing MinPathSlack in edge 115, and vice versa; for logic level 3, any delay change to any of edges 113, 114 and 116 has no effect on MinPathSlack of the other edges for logic level 3. For logic level 1 it is a bit less complicated, as only one connection, namely, connection AB of FIG. 1A, exists within logic level 1.

Another way of considering independence is by changes in logic level or logic level "hops" from a driver object. For AB, where A is a driver or source object, for example a flip-flop, memory or other logic block, there is only one logic level hop, namely, logic level 1. For BC and BD, there are two logic level hops for each—one logic level hop for each from driver object A and one logic level hop for each from driver object B. Connections BC and BD are independent as any delay change in BC will not impact the slack of any path going through BD. This same analysis may be applied to the example of logic level 3.

Accordingly, network 10, as broken up by logic level, forms a logic tree of connections. Each branch or edge parameter of a tree may be weighted, for example with a delay. Suppose that PathSlack for path: ABCE is −20 picoseconds (ps), ABCF is −15 ps, and ABDG is −10 ps. In other words, routing for each of these paths is critical as PathSlack is a negative value. With this logic tree structure, additional terms for characterizing such a tree are introduced, namely, "minimum path slack" and "number of critical paths."

Figure 1C:
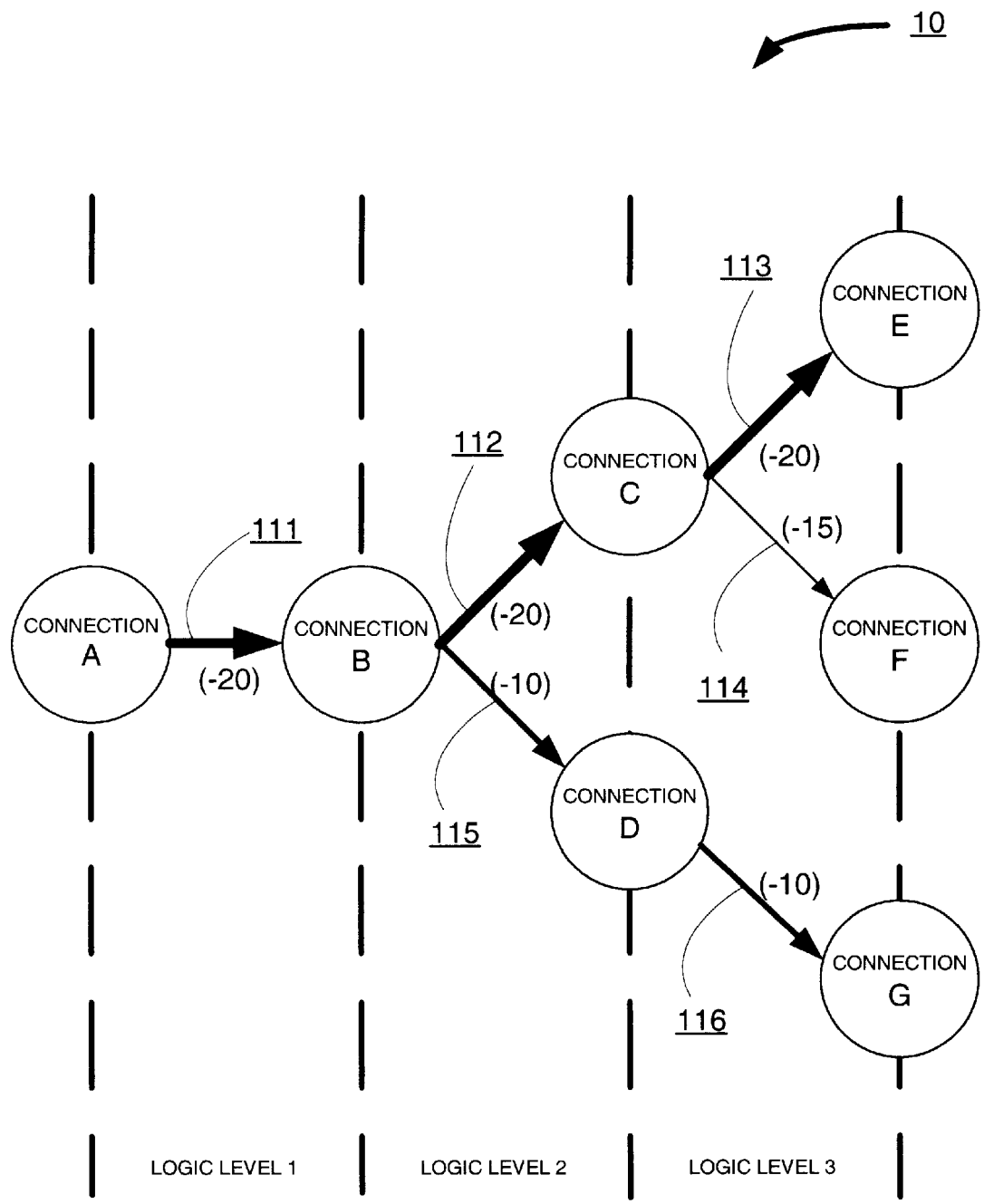

Minimum Path Slack ("MinPathSlack") through a connection is the minimum of the path slacks of all paths passing through that connection. Recall the above example where PathSlack for path ABCE is −20 picoseconds (ps), for path ABCF is −15 ps, and for path ABDG is −10 ps. Continuing the above example, MinPathSlack for each connection is as follows: connection AB has minus 20 ps, connection BC has minus 20 ps, and connection CE has minus 20 ps. Continuing the above example for path ABCF, all other MinPathSlacks have been made, as MinPathSlack for ABCE is a larger negative delay than MinPathSlack for ABCF, except however for connection CF which is not part of path ABCE; connection CF has a MinPathSlack of minus 15 ps. For path ABDG, AB has a MinPathSlack of minus 20 ps, so the remaining connections of BD and DG are each have a MinPathSlack of minus 10 ps. These example edge parameters are indicated in FIG. 1C. Thus, initially a MinPathSlack attribute for each connection is the worst PathSlack among all paths using such connection.

Number of critical paths ("NumCritPath") is for timing paths going to a connection or passing through that connection object as in FIG. 1A, the number of such timing paths that are below a threshold value, such as have a negative PathSlack. To update timing as described herein, both MinPathSlack and NumCritPath values are updated, for example by a function call for resetting targets. An example of a slack allocator for updating timing is described below as a function call to reset targets ("resettargets"). Such a function call may be implemented in a timing engine of a routing tool.

MinPathSlack and NumCritPath for the example as shown in the network diagram of FIG. 1C are listed in Table

1.

TABLE 1

| Connection | MinPathSlack | NumCritPath |
|---|---|---|
| AB | −20 ps | 3 |
| BC | −20 ps | 2 |
| CE | −20 ps | 1 |
| CF | −15 ps | 1 |
| BD | −10 ps | 1 |
| BG | −10 ps | 1 |

For clarity of description, PathSlack value examples have been used; however, such values are not intended to be limiting or even representative of delays that may be used. Rather, such delay values are merely used to clearly describe one or more aspects of the present invention. One of skill in the art will accordingly appreciate that actual connection delays will be at least one of circuit design or semiconductor process dependent.

Recasting resources as independent connections within respective logic levels, such as logic levels 1, 2 and 3, facilitates costing such connections by MinPathSlack and NumCritPath. For delay routing, it is important to choose a logic level that enhances optimization, as explained below in more detail. It should be understood that routing a subset of connections in delay mode rather than routing all connections in delay mode obtains a better result, because of minimum constraining. Not only is a better result obtained, but also less runtime is used. Hence, an ideal scenario would be to route a minimum possible set of critical connections and still meet the path delay targets.

A logic level 2 may not have as much impact as a logic level higher up or lower down the logic tree, such as logic level 1. Moreover, delays may be close to a floor delay, so a selection should account for available improvement in delay. To evaluate logic level, a heuristic may be used to identify a logic level to route in delay mode.

A heuristic uses contribution of each connection in a logic level as a metric to compare logic levels. As all connections in a same logic level are independent, as they are on different paths, all such connections for a selected logic level may be routed simultaneously, as described above, without affecting other connections in such a selected logic level.

Consider a timing connection, c, with delay, d, and floor delay, f. Total contribution, $C_L$, of a logic level, L, may be described as a summation of $C_i$, the contribution of a connection i, over all connections belonging to the logic level L, for example a total of $n_L$ connections for such a logic level, L, or:

$$C_L = \Sigma c_i \text{ for } i \text{ from } 1 \text{ to } n_L \quad (1).$$

Scope of improvement of a contribution, c, is the difference between delay, d, and floor delay, f, or:

$$\Delta c = (d - f) \quad (2).$$

Contribution, c, may be expressed in terms of MinPathSlack, M, and NumCritPath, N, using Equation (2), as:

$$c = (d - f)N/|M| \quad (3).$$

Floor delays conventionally are difficult to compute, as such computation consumes a significant amount of runtime. Moreover, calculating actual floor delay is a non-trivial matter in itself. However, in the absence of actual floor delay, floor delay, f, may be approximated or estimated as one-half of a timing connection delay, d, or 0.5d. Notably, an initial value for delay, d, is obtained from resource routing, as described in a routing process below. Resource routing does not minimize delay but minimizes total wire length for signal propagation, and thus 0.5d is a reasonable assumption. In other words, it is reasonable to assume that resource routing delays are approximately twice as long as delay routing delays. Accordingly, Equation (3) may be written as:

$$c = (0.5dN)/|M| \quad (4).$$

Alternatively, other estimated percent improvements, as well as a modeled floor delay, may be used. By having M in the denominator, it should be understood that an indication of how much a connection contributes to the entire MinPathSlack, M, of a logic level. Moreover, by using the absolute value of M, it should be understood that only connections within a logic level with critical connections, as described above, are used in determining connection contributions, c.

Other heuristics for selecting logic levels may be used, such as selecting the logic level with the minimum number of connections at each step, selecting the logic level with the maximum number of connections at each step, selecting the logic level with the maximum number of critical paths flowing through it, and selecting the logic level with the maximum number of NumCritPaths and with the minimum number of connections, among other combinations of selections.

Figure 3A:
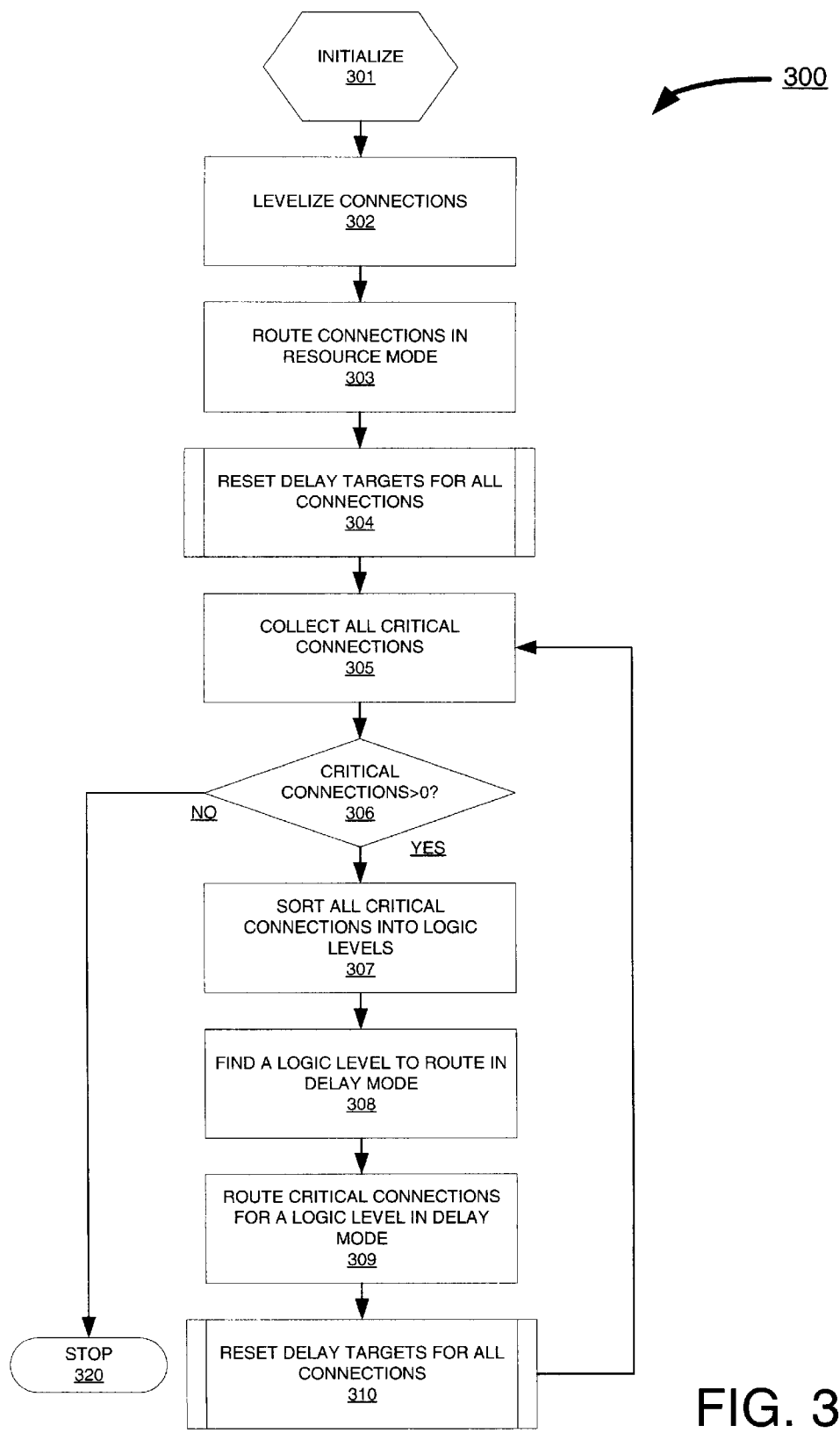
FIGS. 3A and 3B are process flow diagram of an exemplary embodiment of a routing process in accordance with one or more aspects of the invention.

FIG. 3A is a process flow diagram of an exemplary embodiment of a routing process 300 in accordance with one or more aspects of the invention. At step 301, routing process 300 is initialized. At step 302, connections in a network to be routed are levelized. By levelizing connections, it is meant that logic levels are identified, or more particularly logic level values, which can be considered as a fixed property of a connection in an unchanging design, are evaluated. Logic level of a connection refers to a threshold, such as the maximum or minimum, number of connections traversed from a source (for example, a flip flop) object in a timing graph to reach such a connection. Thus, such a number of connections may be used as a logic level value or index number.

At step 303, connections are routed in resource mode. As mentioned above, this routing will yield a value for delay, d, for each of the connections routed.

At step 304, timing information of such a resource-routed network is updated. This updating may be done with a resettargets function call made to a timing engine of a router. Timing information update includes determining PathSlack for connections. As mentioned above with respect to the prior art, by attempting to and meeting a target does not necessarily obtain a best solution, unless such a target happens to be a best solution. To ensure better targeting, timing information update at step 304 includes obtaining MinPathSlack and NumCritPaths values for all connections. Slack initially is MinPathSlack which may be attributed to connects by a slack allocator. Thus, attributing MinPathSlack to connections facilitates improved targeting.

At step 305, all critical connections after timing information is updated are identified and collected. As mentioned above, a critical connection is one with a negative slack value—meaning delay is too long to meet a performance objective.

At step 306, a check is made to determine if any critical connections exist. If none exist, then routing process 300 stops at step 320. If, however, the number of critical connections is greater than zero, then a delay mode routing process begins at step 307 with sorting of critical connections. Critical connections are sorted by logic level. Critical connections may further be sorted based on signal identification or MinPathSlack or both. Using MinPathSlack and signal identification within a logic level may be used such that the worst connection of a signal may be given a higher priority.

At step 308, a heuristic is used to identify a logic level for routing in delay mode. An example of such a heuristic is described elsewhere herein. In accordance with the exemplary heuristic described, once all logic levels are evaluated, a logic level with a maximum contribution per connection is selected. Moreover, logic levels whose contribution is less than a threshold amount may be ignored initially. However, if one or more critical connects still exist after completing optimization using such a threshold, then those logic levels below such a threshold may be considered, or alternatively, such a threshold may be adjusted such that other logic levels are considered.

At step 309, critical connections from a logic level identified at step 308 are routed in delay mode. This routing is used to find a minimum delay for such critical connections.

At step 310, timing information of such a delay-routed network is updated. This updating may be done with a resettargets function call made to a timing engine of a router. Timing information update includes re-determining PathSlack for connections. Timing information update at step 310 further includes obtaining updated MinPathSlack and NumCritPaths values for all connections.

After timing information is updated at step 310, critical connections are collected at step 305 in view of such updated timing information from step 310. At step 306, a check is made to determine if any critical connections exist. If none exist, then routing process 300 stops at step 320. If, however, the number of critical connections is greater than zero, then a delay mode routing process begins a new at step 307 with sorting of critical connections responsive to timing information updated, and thus routing changes, made from a prior iteration of a delay mode routing.

Figure 3B:
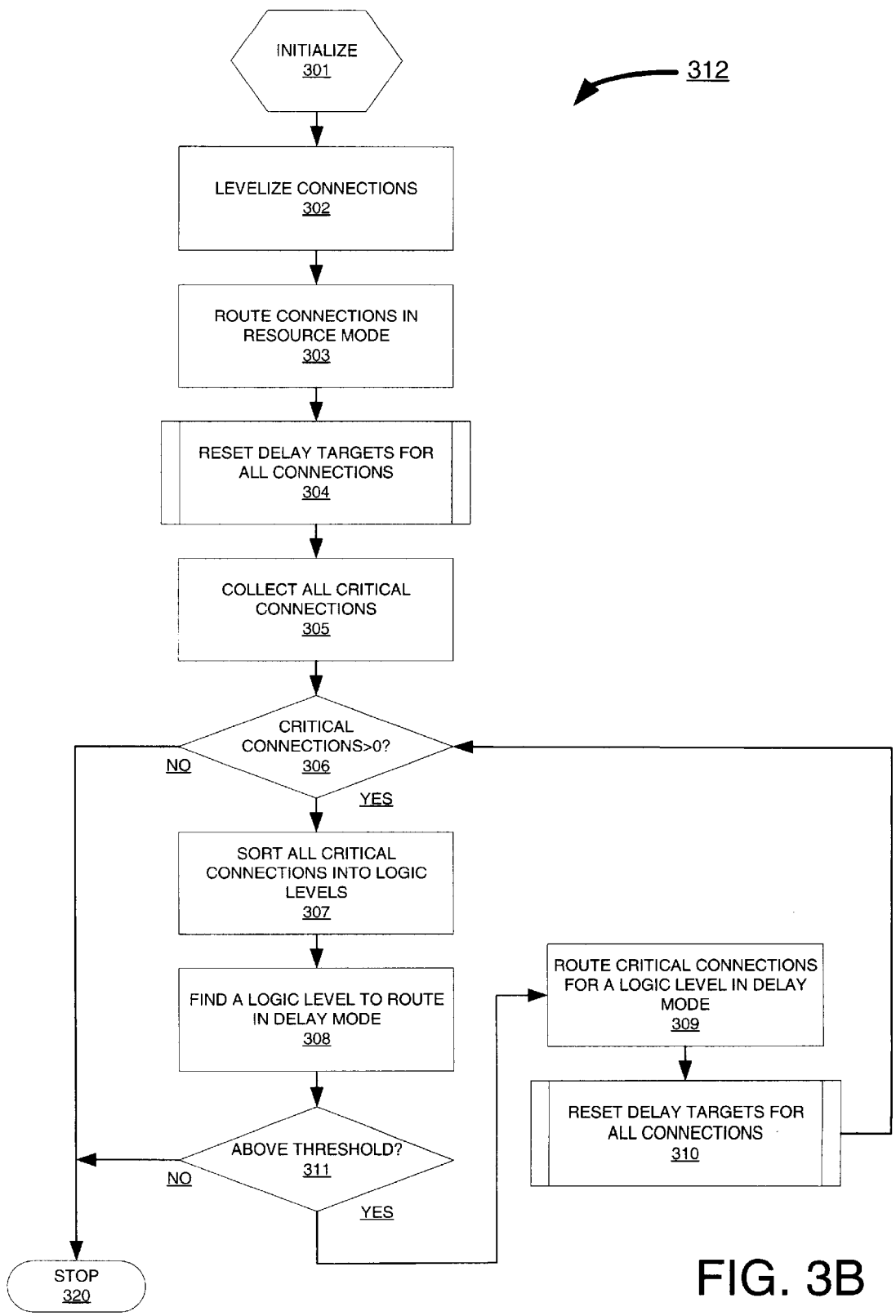

Routing process 300 continues until there are no critical connections at step 306. Alternatively, as shown in FIG. 3B, an alternative routing process 312 is shown having a step 311, which may be inserted after a logic level is identified for routing in delay mode at step 308 of routing process 300. If such a logic level is equal to or falls below a contribution per connection threshold, then routing process ends at step 320. If, however, such a logic level is above a contribution per connection threshold, then routing process 300 continues at step 309. This additional step 311 may be used to ensure that sufficient headroom for improvement exists before incurring runtime cost for routing in a delay mode at step 309.

Figure 4:
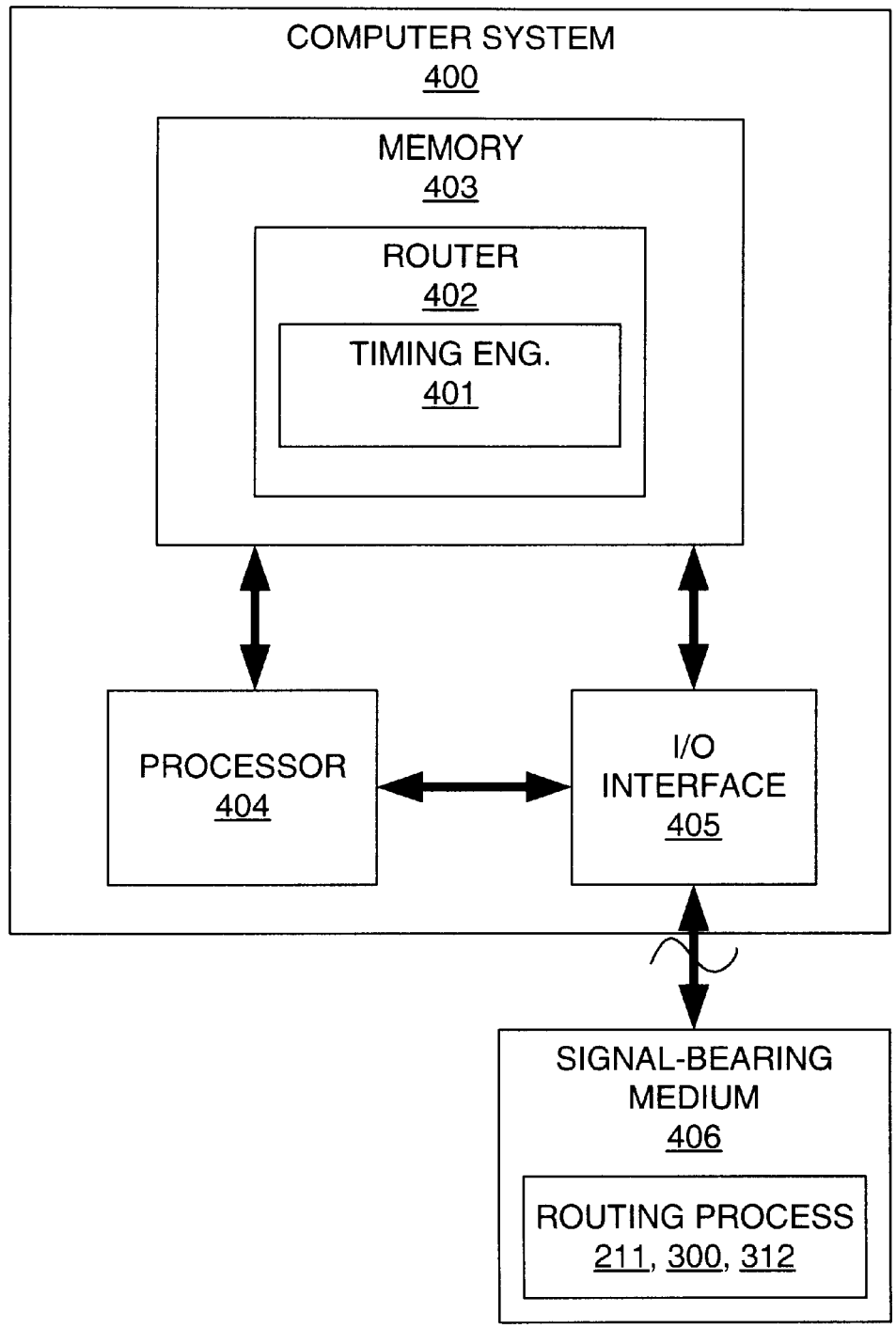
FIG. 4 is a block diagram of an exemplary embodiment of a programmed computer system in accordance with one or more aspects of the invention.

FIG. 4 is a block diagram of an exemplary embodiment of a programmed computer system 400 in accordance with one or more aspects of the invention. Computer system 400 comprises at least one processor 404 coupled to memory 403 and to I/O interface 405. Optionally, I/O interface 405 may be coupled to memory 403 for direct memory addressing. Memory 403 is programmed with all or a portion of a router 402. Router 402 comprises or may be put in communication with a timing engine 401. Router 402 is configured to perform resource mode routing and delay mode routing. Routing processes 300 or 312 or both may be on signal-bearing medium 406 for communication with computer system 400, and in particular router 402, as well as timing engine 401.

One or more aspects of the invention are implemented as one or more program products for use with a computer system such as, for example, computer system 400. The program(s) of the program product defines functions of the one or more aspects and can be contained on a variety of signal-bearing media, such as signal-bearing medium 406, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the invention, represent one or more aspects of the invention.

While the foregoing is directed to the preferred embodiment of the invention, other and further embodiments of the invention may be devised without departing from the basic scope thereof, and the scope thereof is determined by the claims that follow.

What is claimed is:

1. A method for identifying routing for interconnects for an integrated circuit, the method comprising:
   identifying logic levels for the interconnects;
   routing the interconnects responsive to a first criteria, wherein the first criteria is for a resource mode;
   updating timing information associated with the interconnects routed;
   assembling a set of at least one connection from the interconnects routed responsive to the timing information updated, at least the one connection having a respective negative slack;
   identifying a logic level of the logic levels responsive to at least a portion of the set; and
   iterative rerouting of the at least one connection for the logic level responsive to a second criteria, wherein the second criteria is for a delay mode.

2. The method according to claim 1, wherein the logic levels are identified after the interconnects are routed.

3. The method according to claim 1, further comprising re-updating the timing information responsive to the rerouting.

4. The method according to claim 3, further comprising determining whether none of the interconnects exceed respective target path delays.

5. The method according to claim 4, wherein the logic levels are identified after the updating of the timing information.

6. The method according to claim 5, wherein the first criteria is for a resource mode.

7. The method according to claim 6, wherein the second criteria is for a delay mode.

8. The method according to claim 7, wherein the step of updating comprises resetting minimum path slack and number of critical paths for each of the connections.

9. The method according to claim 8, further comprising determining the minimum path slack for each of the connections.

10. The method according to claim 8, further comprising determining the number of critical paths passing through each of the connections.

11. The method according to claim 1, wherein the step of identifying the logic level comprises:
   determining timing contribution of each of the interconnects for each of the logic levels; and
   summing the timing contribution of each of the interconnects for each of the logic levels to provide respective total timing contributions.

12. The method according to claim 11, wherein the step of identifying the logic level comprises ranking the logic levels by the total timing contributions.

13. The method according to claim 12, wherein the step of identifying the logic level comprises selecting the logic level at least equal to a largest of the total timing contributions for the logic levels.

14. The method according to claim 12, further comprising re-ranking the logic levels for each subsequent identification of the logic level.

15. The method according to claim 11, further comprising checking whether each of the total timing contributions for each of the logic levels is below a threshold total timing contribution.

16. The method according to claim 11, further comprising using half of interconnect delay as a floor delay value.

17. The method according to claim 11, wherein the step of identifying the logic level comprises initially ignoring at least one of the total timing contributions below a threshold total timing contribution.

18. The method according to claim 1, wherein the steps of updating and re-updating comprise determining a number of critical paths for each connection.

19. A method for routing interconnects for a network, comprising:
   characterizing the network into logic levels, the logic levels having a property of independence of connections within each of the logic levels, wherein the property of independence of connections is defined by at least one of timing paths and timing updates; and
   changing state of the connections within a logic level, wherein the changing the state is done by routing the connections within the logic level.

20. A method for routing connectors for a network, the method comprising:
   identifying a threshold number of the connectors needed to traverse from a source object to a load object, wherein the threshold number is at least one of a minimum number and maximum number; and
   indexing logic levels in response to the threshold number of the connectors identified, wherein the connections all have a negative minimum path slack.

21. The method according to claim 20, further comprising routing of connections within a logic level of the logic levels.

22. A signal-bearing medium containing a program which, when executed by a processor, causes execution of a method comprising:
   identifying logic levels for the interconnects, the logic levels including a property of independence for each portion of the interconnects thereof;
   routing the interconnects responsive to a first criteria, wherein the first criteria is for a resource mode;
   updating timing information associated with the interconnects routed;
   assembling a set of at least one connection from the interconnects routed responsive to the timing information updated, at least the one connection having a respective negative slack;
   identifying a logic level of the logic levels responsive to at least a portion of the set; and
   iterative rerouting of the at least one connection for the logic level responsive to a second criteria, wherein the second criteria is for a delay mode.

* * * * *